US010044202B2

(12) United States Patent
Coq et al.

(10) Patent No.: US 10,044,202 B2
(45) Date of Patent: Aug. 7, 2018

(54) AUTOMATICALLY DISCHARGING A RECHARGEABLE BATTERY

(71) Applicant: International Business Machines Corporation, Armonk, NY (US)

(72) Inventors: Marc H. Coq, Hopewell Junction, NY (US); Richard J. Fishbune, Rochester, MN (US); Mark E. Maresh, Wake Forest, NC (US); Eric B. Swenson, Pine Island, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/858,257

(22) Filed: Dec. 29, 2017

(65) Prior Publication Data
US 2018/0131206 A1 May 10, 2018

Related U.S. Application Data

(63) Continuation of application No. 15/343,504, filed on Nov. 4, 2016.

(51) Int. Cl.
*H02J 7/00* (2006.01)
*G01R 31/36* (2006.01)

(52) U.S. Cl.
CPC ........ *H02J 7/0029* (2013.01); *G01R 31/3689* (2013.01); *H02J 7/0047* (2013.01);
(Continued)

(58) Field of Classification Search
CPC .. H02J 7/0029; H02J 7/0047; H02J 2007/004; H02J 2007/005; H02J 2007/0037; G01R 31/3689
(Continued)

(56) References Cited

U.S. PATENT DOCUMENTS

| 5,119,009 A | 6/1992 | McCaleb et al. |
| 6,291,973 B1 | 9/2001 | Lee |

(Continued)

FOREIGN PATENT DOCUMENTS

| CN | 104502852 A | 4/2015 |
| CN | 103532106 B | 5/2016 |

(Continued)

OTHER PUBLICATIONS

"UPS Enhances Dangerous Goods Service Areas", Service Update, Updated Aug. 1, 2016, Copyright © 1994-2016 United Parcel Service of America, 2 pages, printed on Aug. 31, 2016, <https://www.ups.com/content/us/en/about/news/service_updates/20160111_lithiumbattery_US.html>.

(Continued)

*Primary Examiner* — Nathaniel Pelton
(74) *Attorney, Agent, or Firm* — Alexander G. Jochym

(57) ABSTRACT

An apparatus is provided for an electrical component to automatically provide a discharge of a rechargeable battery to a predetermined state of charge. The apparatus includes the electrical component determining a rechargeable battery is not connected to a device and discharging the rechargeable battery. The apparatus includes the electronic component determining whether a state of charge exceeds the predetermined state of charge in the rechargeable battery and responsive to determining that the state of charge exceeds the predetermined state of charge, continuing discharging the rechargeable battery.

1 Claim, 3 Drawing Sheets

(52) U.S. Cl.
CPC ... *H02J 2007/004* (2013.01); *H02J 2007/005* (2013.01); *H02J 2007/0037* (2013.01)

(58) Field of Classification Search
USPC ........................................................ 320/136
See application file for complete search history.

(56) References Cited

U.S. PATENT DOCUMENTS

| | | | |
|---|---|---|---|
| 6,774,636 | B2 | 8/2004 | Guiheen et al. |
| 8,450,975 | B2 | 5/2013 | Kim |
| 8,766,599 | B2 | 7/2014 | Kim |
| 9,184,608 | B2 | 11/2015 | Esnard et al. |
| 2003/0112011 | A1 | 6/2003 | Guiheen et al. |
| 2007/0029993 | A1 | 2/2007 | Chao et al. |
| 2009/0108808 | A1 | 4/2009 | He et al. |
| 2009/0197156 | A1 | 8/2009 | Goto |
| 2011/0057622 | A1 | 3/2011 | Kim |
| 2011/0074355 | A1 | 3/2011 | Dao et al. |
| 2013/0106362 | A1 | 5/2013 | Mackintosh et al. |
| 2013/0200855 | A1 | 8/2013 | Christensen et al. |
| 2013/0241488 | A1* | 9/2013 | Dao ..................... H02J 7/0022 320/111 |
| 2013/0307480 | A1 | 11/2013 | Boggs et al. |
| 2015/0194827 | A1 | 7/2015 | Sakagami |
| 2015/0364941 | A1* | 12/2015 | Widmer ............... H02J 7/0063 713/300 |
| 2016/0159229 | A1 | 6/2016 | Enomoto |
| 2016/0322676 | A1* | 11/2016 | Jun ..................... H01M 10/486 |

FOREIGN PATENT DOCUMENTS

| | | | |
|---|---|---|---|
| CN | 105811502 | A | 7/2016 |
| KR | 100713117 | B1 | 5/2007 |
| KR | 100933088 | B1 | 12/2009 |

OTHER PUBLICATIONS

U.S. Appl. No. 15/343,504, filed Nov. 4, 2016.
List of IBM Patents or Patent Applications Treated as Related. Filed Herewith. 2 pages.

* cited by examiner

AUTOMATICALLY DISCHARGING A RECHARGEABLE BATTERY

The present invention relates generally to energy storage devices, and more particularly to automatically discharging a rechargeable battery.

A rechargeable battery may be used in sustainable power applications. When the rechargeable battery is removed from a respective operating device, the rechargeable battery may retain a residual charge. The residual charge may vary due to various factors such as a type of rechargeable battery, an initial charge, an internal temperature, etc. Over time, the residual charge of the rechargeable battery may decrease at a rate dependent on the various factors.

A rechargeable battery may include a built-in battery management system (BMS) that can internally measure voltage and current, and determine a charge level and State of Health (SoH) parameters, including a state of cells within the battery.

Electrical discharge methods and circuits can vary from a simple resistive-capacitive (RC) network to more complex transistor and computer controlled methods. Some electrical discharge methods may control a variance in a rate of discharge, and may monitor and communicate a state of discharge.

SUMMARY

Embodiments of the present invention disclose a method, a computer program product, and a system for an electrical component executing control logic to provide a discharge of a rechargeable battery to a predetermined state of charge. The method using an electrical component includes determining a rechargeable battery is not connected to a device with a sensor where the sensor determines a status of at least one of a physical function or an electrical connection. The method includes the electrical component determining whether an indication to override discharging of the rechargeable battery is received and responsive to receiving the indication to override discharging of the rechargeable battery, the electrical component halting discharge of the rechargeable battery. When the electrical component is not receiving the indication to override discharging of the rechargeable battery, the method includes the electrical component discharging rechargeable battery using a passive discharge component in a portion of the rechargeable battery. Additionally, the method includes the electrical component determining a state of charge by retrieving the state of charge from one of an internal battery management system or an external tester connected to the rechargeable battery and determining whether the state of charge is below a minimum threshold state of charge, where the minimum threshold state of charge is determined based on one of a predetermined minimum threshold state of charge or a user-selected minimum threshold state of charge input by user on a dial, a button, a switch, a toggle, or a touch screen provided by a charge indicator in the rechargeable battery. The method includes the electrical component communicating whether a state of charge is below the minimum threshold state of charge to a charge indicator, wherein the charge indicator indicates that the recharge battery is below the predetermined minimum threshold by a first color. Furthermore, the method includes determining whether a state of charge exceeds the predetermined state of charge in the rechargeable battery wherein the predetermined state of charge is one of a configured predetermined maximum threshold state of charge or a user-selected maximum threshold state of charge input by user on a dial, a button, a switch, a toggle, or a touch screen provided by a charge indicator in the rechargeable battery. When the electrical component determines that the state of charge exceeds the predetermined state of charge, the method includes continuing discharging the rechargeable battery and communicating that the state of charge exceeds the predetermined state of charge to the charge indicator wherein the charge indicator indicates that the rechargeable battery is above the predetermined maximum threshold state of charge by a second color. The method includes the electrical component determining whether the state of charge for the rechargeable battery that exceeded the predetermined state of charge does not exceed the predetermined state of charge and when the electrical component determines that the state of charge for the rechargeable battery that exceeded the predetermined state of charge does not exceed the predetermined state of charge, the method includes the electrical component halting discharge the rechargeable battery and communicating that the state of charge does not exceed the predetermined state of charge and is not below the minimum threshold state of charge to the charge indicator wherein the charge indicator indicates by a third color that the rechargeable battery does not exceed the predetermined state of charge and is not below the minimum threshold state of charge.

DETAILED DESCRIPTION

Embodiments of the present invention recognize that various shipping requirements impose a maximum state of charge for shipments of lithium batteries unattached to an electrical device or equipment.

Embodiments of the present invention provide the ability to detect when a rechargeable battery is unattached to an electronic device and begin automatically discharging the rechargeable battery to ensure that a maximum threshold state of charge is not exceeded. Embodiments of the present invention automatically discharge the rechargeable battery below the maximum threshold state of charge and provide a user with the ability to override the maximum threshold state of charge. Embodiments of the present invention provide a method to display to a user when a rechargeable battery is above or is at or below the configured maximum threshold state of charge.

Implementation of such embodiments may take a variety of forms, and exemplary implementation details are discussed subsequently with reference to the Figures.

As will be appreciated by one skilled in the art, aspects of the present invention may be embodied as a method or system. Accordingly, aspects of the present invention may take the form of an entirely hardware embodiment, an entirely software embodiment (including firmware, resident software, micro-code, etc.), or an embodiment combining software and hardware aspects that may all generally be referred to herein as a "circuit," "module," or "system." Furthermore, aspects of the present invention may take the form of a computer program product embodied in one or more computer-readable media having computer readable program code/instructions embodied thereon.

Figure 1:
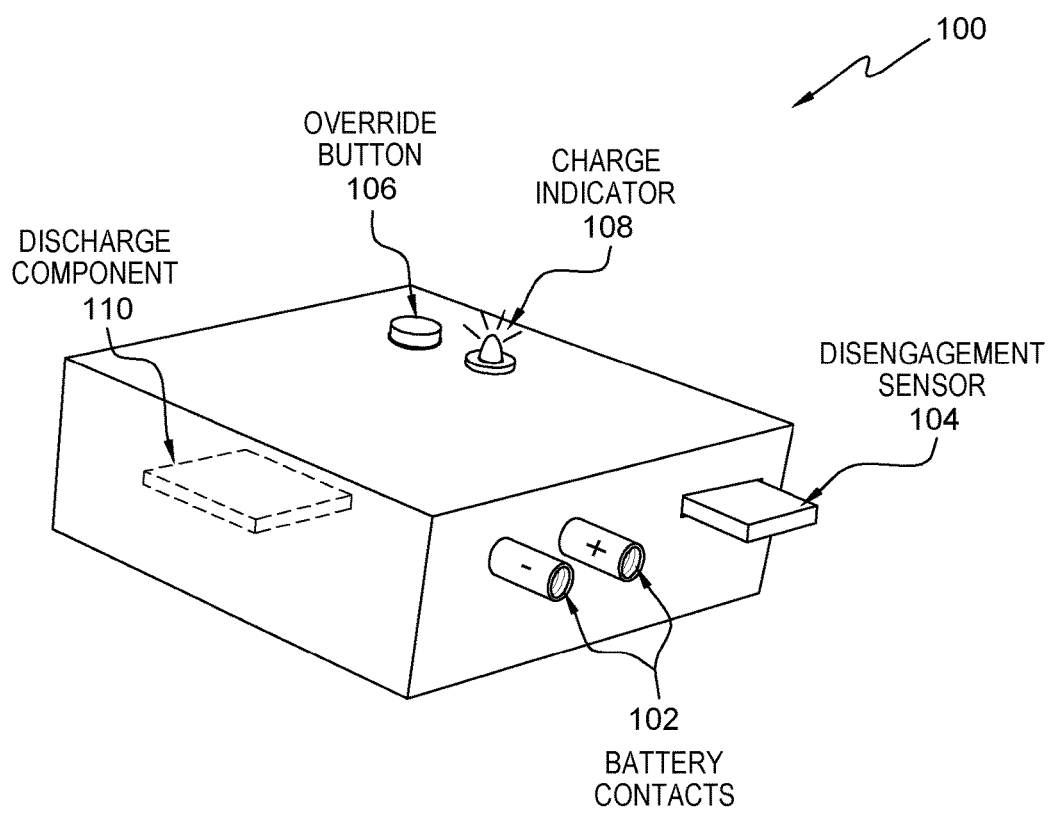
FIG. 1 is a functional block diagram illustrating a rechargeable battery, in accordance with an embodiment of the present invention.

The present invention will now be described in detail with reference to the Figures. FIG. 1 provides only an illustration of one implementation and does not imply any limitations with regard to the environments in which different embodiments may be implemented. Many modifications to the depicted environment may be made by those skilled in the art without departing from the scope of the invention as recited by the claims. FIG. 1 illustrates a rechargeable battery, generally designated 100.

Rechargeable battery 100 is a rechargeable battery that provides the capability to power one or more devices (not shown), and automatically discharge to a predetermined state of charge upon removal from the one or more devices. Rechargeable battery 100, while depicted in FIG. 1 as one shape, may be any of a number of shapes and sizes corresponding to its use with the one or more devices. In one embodiment, rechargeable battery 100 includes battery contacts 102, which include a positive and a negative terminal, that provide an electrical connection between rechargeable battery 100 and one or more devices. In various embodiments, rechargeable battery 100 includes a built-in battery management system (not shown) automatically determining a state of charge, where the state of charge is a resident electrical charge of internal cells of the rechargeable battery. In one embodiment, rechargeable battery 100 includes disengagement sensor 104 that provides a capability to determine a connection between rechargeable battery 100 and the one or more devices.

In various embodiments, rechargeable battery 100 includes override button 106, which may be an external button providing a user with a capability to override an automatic discharge sequence, and charge indicator 108 which communicates a state of charge of rechargeable battery 100. Rechargeable battery 100 includes an integrated internal discharge component 110, which provides a capability to determine a status of rechargeable battery 100 connection to one or more devices via disengagement sensor 104, determine a state of charge, determine whether to discharge rechargeable battery 100 to a predetermined maximum threshold state of charge, and initiate the discharge of rechargeable battery 100. In various embodiments, rechargeable battery 100 may be a rechargeable smart battery. A rechargeable smart battery includes a built-in battery management system, which can internally measure voltage, current, state of health parameters and state of charge of the cells of the battery. Rechargeable battery 100 can include but is not limited to, a Lithium-ion (Li-ion) rechargeable smart battery, Lithium-ion polymer rechargeable battery, a Nickel-cadmium (NiCd) rechargeable smart battery, or the like, and may include an integrated voltage monitoring circuit or other logic components accessible to a battery management system.

Battery contacts 102 are electrical contacts that provide the capability to connect a rechargeable battery, such as rechargeable battery 100, to one or more devices. In one embodiment, battery contacts 102 may consist of a positive and negative terminal pair that provides an electrical connection between, for example, rechargeable battery 100, and one or more devices, such as a personal smartphone, a computing device, and medical equipment, etc. In some embodiments, battery contacts 102 may include a variety of shapes, sizes, materials, etc., to match specific applications. For example, battery contacts 102 may be copper tubular-shaped terminals each approximately 0.25-inch long and 0.125-in in diameter. In another example, battery contacts 102 may be silver nickel alloy flat tabs each approximately 0.25-inch square.

Disengagement sensor 104 is a sensor that provides the capability to monitor a connection of rechargeable battery 100 to one or more devices through a connection terminal, such as battery contacts 102. In some embodiments, disengagement sensor 104 may include a physical function to determine a connection of rechargeable battery 100 to one or more devices (e.g., a toggle or button indicating the presence of a device connected to rechargeable battery 100). In various embodiments, disengagement sensor 104 may be an internal sensor that includes an electrical function to determine a connection of rechargeable battery 100 to the one or more devices (e.g., an electrical current sensor). For example, disengagement sensor 104 may change an electrical status of a switch, which can then be recognized by an electrical circuit or computer interface, such as a Universal Serial Bus (USB), and communicate a status to discharge component 110. In an embodiment, disengagement sensor 104 is a light sensor used to determine if one or more devices are connected to rechargeable battery 100 (e.g., a device connected to rechargeable battery 100 blocks light to disengagement sensor 104).

Override button 106, as depicted, is an external button integrated with rechargeable battery 100 that provides the capability for a user to override an automatic discharge sequence. In some embodiments, override button 106 allows a user to select one or more modes of operation or may provide the capability to trigger other internal functions. For example, override button 106 may provide the capability to initiate a charge indication function of rechargeable battery 100 through charge indicator 108. In one embodiment, a user interface on another device provides the function of override button 106 to receive and communicate to discharge component 110 a user input to override (stop) a discharge of rechargeable battery 100. For example, a user interface in a smartphone receives a user input via an app to override an automatic discharge of smartphone rechargeable battery 100 communicated to discharge component 110.

In an embodiment, override button 106 provides the ability to select one or more maximum threshold state of charge for discharge component 110 and charge indicator 108. For example, override button 106 may be a dial with one or more selections, such as override maximum threshold, set maximum threshold at 20% of state of charge, or set maximum threshold at 30% of state of charge. In one embodiment, a user input on an override button external to rechargeable battery 100, for example, a button on a connected device, may be communicated to discharge component 110 via the device connection (i.e., prior to disconnection from rechargeable battery 100) or via another communication method (e.g., USB, wireless, etc.).

Charge indicator 108, as depicted, is an external feature of a rechargeable battery, such as rechargeable battery 100, which provides the capability to communicate a state of charge for rechargeable battery 100. In one embodiment, charge indicator 108 can be a multicolored light emitting diode (LED), which may illuminate different colors to represent different states of charge of a rechargeable battery, such as rechargeable battery 100. For example, an illumination of red by the LED may represent a state of charge above a predetermined maximum threshold state of charge, and alternatively, an illumination of green by the LED may represent a state of charge at or below the predetermined maximum threshold state of charge of rechargeable battery 100. In one embodiment, charge indicator 108 may indicate, for example by displaying a yellow color, a state of charge for the rechargeable battery at or below a predetermined minimum state of charge (e.g., illuminates with a yellow color for a state of charge at or below 15%). In one embodiment, charge indicator 108 can be a LED or other light source that provides different modes of illumination to indicate a state of charge with respect to a maximum threshold state of charge. For example, an LED or a light blinks when a state of charge for rechargeable battery 100 is not connected to a device or is above a predetermined or maximum threshold state of charge. Alternatively, the LED or light goes off when the state of charge for disconnected rechargeable battery 100 is at or below the maximum threshold state of charge. In some embodiments, charge indicator 108 may be an array of LEDs or any other type of visual indicator for representing a state of charge. In an alternative embodiment, charge indicator 108 may produce an audible signal, such as a beep sound, or sequence of beep sounds, representing a state of charge for a rechargeable battery. In an embodiment, charge indicator 108 is an indicator displaying a current or real-time state of charge using a pointer or hand on a numerical indicator similar to a clock face. In another embodiment, charge indicator 108 provides a numerical display of a real-time state of charge, such as an LED display of a numerical representation of the real-time or current state of charge for a rechargeable battery.

In some embodiments, charge indicator 108 may receive a user input state of charge (e.g., by a dial, a toggle switch, a numerical input method, etc.) for a predetermined state of charge (e.g., a maximum or a minimum threshold state of charge). In one embodiment, a user interface on another device provides the function of charge indicator 108 to display a status of a current state of charge from discharge component 110 and/or receive a user input from another device to select a predetermined state of charge (e.g., a maximum or a minimum threshold state of charge) provided to discharge component 110. For example, a user interface in a smartphone receives a user input for a predetermined state of charge communicated wirelessly or directly (wired) to discharge component 110.

In an embodiment, charge indicator 108 is capable of receiving a user input requesting a display of a status of the discharge of rechargeable battery 100. For example, charge indicator 108 can be a clear plastic button capable of displaying a color to a user indicating a status of the state of charge when the user pushes or depresses charge indicator 108. For example, a pressed charge indicator 108 may light up with a red color (e.g., using an LED) indicating that discharge component 110 determined that the state of charge is above the maximum threshold state of charge. In an embodiment, charge indicator 108 receives a user input to select or determine a maximum or a minimum threshold state of charge, for example, using a dial, a switch, or another user interface such as a touch screen capable of receiving a numerical user input for a user-selection of a maximum or a minimum threshold state of charge communicated to discharge component 110.

Discharge component 110 is an electronic component capable of monitoring and regulating a state of charge of rechargeable battery 100. Discharge component 110 includes control logic or integrated charge controller circuitry providing the capability to control the discharge of rechargeable battery 100. In various embodiments, discharge component 110 includes control logic and/or internal circuit elements to determine if rechargeable battery 100 is connected to a device, to determine a state of charge for rechargeable battery, to determine whether rechargeable battery 100 exceeds or is above a maximum threshold state of charge, and discharge components such as a bleeding circuit, for example, using bleed resistors or one or more resistor or other circuit elements capable of discharging rechargeable battery 100. In an embodiment, discharge component 110 controls discharge components such as a bleeding circuit internal to rechargeable battery 100 but external to discharge component 110. In one embodiment, discharge component 110 controls discharge components included within discharge component 110. In some embodiments, discharge component 110 controls a discharge of rechargeable battery when the discharge occurs by an external discharge component, which is external to discharge component 110 and rechargeable battery 100 (e.g., when rechargeable battery 100 is connected to a separate, external source to drain or discharge). Discharge component 110 provides the ability for an automatic discharge of a disconnected rechargeable battery 100 and an ability to override the automatic discharge of a disconnected rechargeable battery 100. In various embodiments, discharge component 110 can be fully integrated, partially integrated, or separate from rechargeable battery 100. In one embodiment, discharge component 110 is a semiconductor device. Discharge component 110 may communicate to charge indicator 108 and/or override button 106 information such as a status of a state of charge with respect to a predetermined state of charge.

In various embodiments, discharge component 110 determines a status of disengagement sensor 104, determines a state of charge, determines whether to discharge rechargeable battery 100 to a predetermined state of charge, and to initiate discharge. In some embodiments, discharge component 110 halts a discharge sequence at a predetermined state of charge based on at least one of a maximum threshold state of charge, a status of override button 106, or a status of disengagement sensor 104. In various embodiments, discharge component 110 includes the function of a battery management system. In one embodiment, discharge component 110 is a portion of a rechargeable smart battery or an external component that includes processors and computing components discussed later with respect to FIG. 3, capable of supporting the function of a computer program (not depicted in FIG. 1) executing the operational steps of discharge component 110 to determine, monitor, and control a discharge of rechargeable battery 100. The operational steps of discharge component 110 to control a discharge of a disconnected rechargeable battery 100 will be discussed further with respect to FIG. 2.

Figure 2:
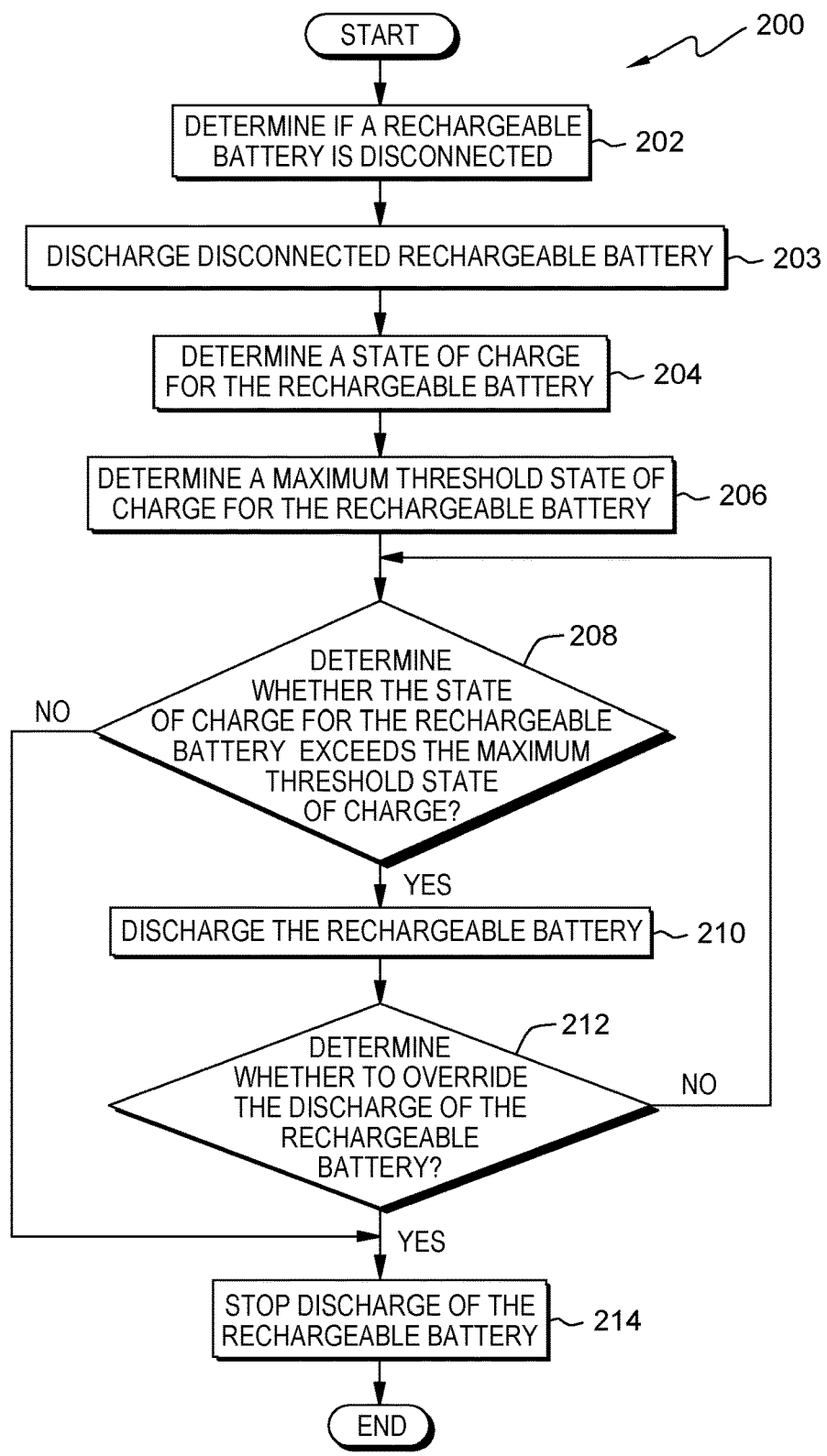
FIG. 2 is a flowchart depicting operational steps of a discharge component in the rechargeable battery of FIG. 1, to automatically discharge a disconnected rechargeable battery to a predetermined state of charge, in accordance with an embodiment of the present invention.

FIG. 2 is a flowchart 200 depicting operational steps of discharge component 110 in rechargeable battery 100 to automatically discharge a disconnected rechargeable battery 100 to a predetermined state of charge, in accordance with an embodiment of the present invention.

Discharge component 110 determines if rechargeable battery 100 is disconnected from one or more devices (202). Rechargeable battery 100 is considered disconnected when rechargeable battery 100 is not connected to any devices or equipment. In one embodiment, discharge component 110 determines whether rechargeable battery 100 is disconnected from one or more devices by utilizing a disengagement sensor, such as disengagement sensor 104, which provides a connection indication for rechargeable battery 100. For example, disengagement sensor 104 determines a status of a switch indicating that an electrical connection is not present when the switch is open. An open switch disconnects one or more devices and rechargeable battery 100, such that discharge component 110 may determine from the indicated status there is no connection between rechargeable battery 100 and one or more devices. In another example, disengagement sensor 104 utilizes an electric current sensor to determine if an electrical connection is open or has been terminated between rechargeable battery 100 and a device or devices. Discharge component 110 may determine that rechargeable battery 100 is disconnected when an absence of an electrical connection between rechargeable battery 100 and a device is detected, or when disengagement sensor 104 indicates no electrical current is detected between rechargeable battery 100 and one or more devices.

Discharge component 110 discharges a disconnected rechargeable battery 100 (203). When rechargeable battery 100 is not connected to a device, discharge component 110 automatically begins discharging rechargeable battery 100. In various embodiments, discharge component 110 may utilize an internal active or an internal passive battery discharge using one or more of a bleeding circuit, a resistor circuit, a capacitive circuit, an electronic load bank, or another battery discharge method (not depicted in FIG. 1) included in discharge component 110 to begin automatically discharging a rechargeable battery 100 that is not connected to a device or equipment. In an embodiment, discharge component 110 automatically begins discharging rechargeable battery 100 using an internal active or an internal passive battery discharge with one or more of a bleeding circuit using bleeder resistors, a resistor circuit, capacitive circuit, or a load bank resident in rechargeable battery 100 but not included in discharge component 110. For example, a bleeding circuit to discharge rechargeable battery 100 resides internally to rechargeable battery 100 separate from discharge component 110. In one embodiment, discharge component 110 automatically begins discharging rechargeable battery 100 utilizing one or more active or passive battery discharge methods such as bleeding circuits, resistor circuits, capacitor circuits, a load bank, active components, or other known battery discharge devices external to rechargeable battery 100.

Discharge component 110 determines a state of charge for rechargeable battery 100 (204). In various embodiments, discharge component 110 determines the state of charge for rechargeable battery 100 from an internal battery management system that includes one or more system parameters that indicate the state of charge. For example, discharge component 110 determines the state of charge of rechargeable battery 100 by retrieving system parameters of the rechargeable battery, such as voltage, current, etc. that indicate the state of charge. In one embodiment, discharge component 110 receives a state of charge for rechargeable battery 100 from an external battery management system or an external tester determined using known methods.

In an embodiment, discharge component 110 queries or requests from an external component or external test equipment, such as a charging table or other battery test equipment as known to one skilled in the art, a state of charge. For example, discharge component 110 connected to an external voltage meter, may retrieve from the external voltage meter, a voltage, and using a known discharge curve of voltage versus state of charge for rechargeable battery 100, determine a current state of charge of rechargeable battery 100. Other known methods for determining a state of charge by test equipment connected to rechargeable battery 100 may include a current integration method such as coulomb counting, voltage method, and the like.

Discharge component 110 determines a maximum threshold state of charge for rechargeable battery 100 (206). In one embodiment, discharge component 110 is configured with a predetermined maximum threshold for a state of charge. For example, discharge component 110 is pre-set or configured with a maximum threshold state of charge such as 30% for a state of charge when rechargeable battery 100 is not connected to a device. In various embodiments, discharge component 110 is configured with a maximum threshold state of charge in response to an internal parameter that may be set by means of a user by a hardware interface. For example, a user-configured or user-selected maximum threshold state of charge may be input to discharge component 110 by one or more of a button, a dial, a switch, a numerical input pad, for example, provided by charge indicator 108, by another user interface external to rechargeable battery 100, or by programmable means, indicating a maximum threshold state of charge or other similar battery electrical measurement.

Discharge component 110 determines whether a state of charge for the rechargeable battery exceeds the maximum threshold state of charge (decision 208). Discharge component 110 compares a current state of charge, for example, received or retrieved from one or more of a battery management system or an external tester, to the predetermined maximum threshold state of charge to determine whether the current state of charge exceeds the maximum threshold state of charge. Responsive to determining the state of charge does not exceed the maximum threshold state of charge (no branch of decision 208), discharge component 110 bypasses discharge of rechargeable battery 100 and monitoring of the state of charge of rechargeable battery 100 by discharge component 110 and stops the discharge of rechargeable battery 100 (214).

Alternatively, responsive to a determination that the state of charge exceeds the maximum threshold state of charge (yes branch of decision 208), discharge component 110 continues the discharge of rechargeable battery 100 (210). Discharge component 110 using one or more of known battery discharge techniques such as a bleeding circuit, or the like continues the automatic discharge of the disconnected rechargeable battery 100 initiated in step 203.

Discharge component 110 determines whether to override the discharge of rechargeable battery 100 (decision 212). Responsive to a status of override button 106, discharge component 110 determines whether to continue discharging rechargeable battery 100 or to stop discharging rechargeable battery 100. In various embodiments, as determined by discharge component 110, a status of override button 106 may be changed at any time after disconnecting rechargeable battery from one or more devices. In an embodiment, as detected by discharge component 110, a status of override button 106 is changed before disconnecting rechargeable battery from one or more devices. For example, a user selection to override automatic discharge of rechargeable battery 100 may be done when override button 106, accessible to the user, is activated before the user removes rechargeable battery 100 from one device. For example, automatic discharge of rechargeable battery 100 may be overridden when a user who is removing rechargeable battery 100 for a re-installment in another device does not desire a discharge of rechargeable battery 100 when rechargeable battery 100 is disconnected from the first device.

Responsive to a status of override button 106 indicating to discharge component 110 to override the discharge of rechargeable battery 100 (yes branch of decision 212), discharge component 110 stops the discharge of rechargeable battery 100 (214). For example, when a user selects or engages override button 106, discharge component 110 halts the discharge of rechargeable battery 100.

In an embodiment, discharge component 110 re-initiates the discharge of rechargeable battery 100 upon a determination of a change in the status of override button 106 from engaged (e.g., override turned on) to disengaged (e.g., override turned off). For example, when discharge component 110 determines override button 106 is activated, preventing the discharge of rechargeable battery 100, and at a later time, override button 106 is de-selected or turned off by a user, discharge component 110 re-initiates the discharge of rechargeable battery 100 and returns to decision 208. Discharge component 110 may receive at any time a user selection or input to re-initiate a discharge of rechargeable battery 100 by de-selecting override button 106. Similarly, a user may select to override the discharge of rechargeable battery 100 at any time, for example, by engaging override button 106. Discharge component 110 may receive, at any time a communication from override button 106, indicating a change in status of override button 106.

Responsive to a status of override button 106 indicating to discharge component 110 that override button 106 is not selected (no branch decision 212), discharge component 110 determines whether the state of charge for rechargeable battery 100 exceeds the maximum threshold state of charge (decision 208), and proceeds as described above until either override button 106 is selected or discharge component 110 determines that the state of charge is at or below a maximum threshold.

In one embodiment, discharge component 110 in step 208, may determine that the state of charge of rechargeable battery 100 is at or below a minimum threshold state of charge. For example, if the state of charge is at or below a predetermined minimum threshold state of charge such as 15% then, discharge component 110 may communicate to charge indicator 108 to indicate a state of charge is at or below the minimum threshold state of charge (e.g., by displaying a yellow light).

In some embodiments, discharge component 110 performs decision step 212 prior to decision step 208 (e.g., may determine whether to override discharge of rechargeable battery before determining whether the state of charge is above a maximum threshold state of charge). In one embodiment, discharge component 110 skips step 203.

Figure 3:
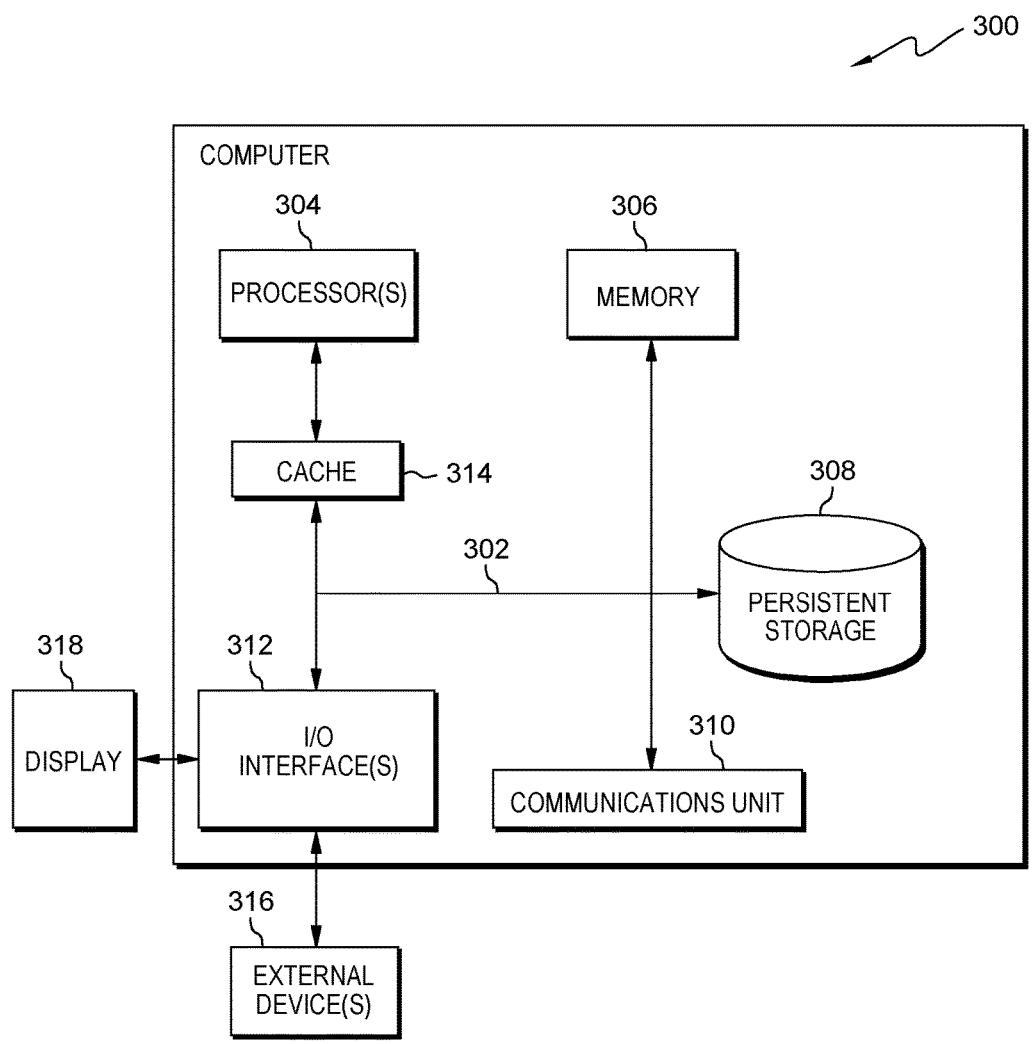
FIG. 3 depicts a block diagram of a component diagram of computing components, such as those of a discharge component as may be present in a rechargeable smart battery executing an automatic discharge of a rechargeable battery as depicted in FIG. 1, in accordance with an embodiment of the present invention.

FIG. 3 depicts a block diagram of computing components 300, such as those of discharge component 110, as may be present in a rechargeable battery executing an automatic discharge of rechargeable battery 100 as depicted in FIG. 1, in accordance with an embodiment of the present invention.

It should be appreciated that FIG. 3 provides only an illustration of one implementation and does not imply any limitations with regard to the environments in which different embodiments can be implemented. Many modifications to the depicted environment can be made.

Discharge component 110 can include processor(s) 304, cache 314, memory 306, persistent storage 308, communications unit 310, input/output (I/O) interface(s) 312 and communications fabric 302. Communications fabric 302 provides communications between cache 314, memory 306, persistent storage 308, communications unit 310, and input/output (I/O) interface(s) 312. Communications fabric 302 can be implemented with any architecture designed for passing data and/or control information between processors (such as microprocessors, communications and network processors, etc.), system memory, peripheral devices, and any other hardware components within a system. For example, communications fabric 302 can be implemented with one or more buses.

Memory 306 and persistent storage 308 are computer readable storage media. In an embodiment, memory 306 includes random access memory (RAM). In general, memory 306 can include any suitable volatile or non-volatile computer readable storage media. Cache 314 is a fast memory that enhances the performance of processor(s) 304 by holding recently accessed data, and data near recently accessed data, from memory 306.

Program instructions for the execution of the operational steps and functions discharge component 110 discussed in FIGS. 1 and 2 are stored in persistent storage 308 for execution and/or access by one or more of the respective processor(s) 304 of discharge component 110 via cache 314. In an embodiment, persistent storage 308 includes a magnetic hard disk drive. Alternatively, or in addition to a magnetic hard disk drive, persistent storage 308 can include a solid-state hard drive, a semiconductor storage device, a read-only memory (ROM), an erasable programmable read-only memory (EPROM), a flash memory, or any other computer readable storage media that is capable of storing program instructions or digital information.

The media used by persistent storage 308 may also be removable. For example, a removable hard drive may be used for persistent storage 308. Other examples include optical and magnetic disks, thumb drives, and smart cards that are inserted into a drive for transfer onto another computer readable storage medium that is also part of persistent storage 308.

Communications unit 310, in these examples, provides for communications with other data processing systems or devices depicted in FIG. 1, including resources of disengagement sensor 104, override button 106, and charge indicator 108. Communications unit 310 may provide communications through the use of either or both physical and wireless communication links. The function and code related to the execution of the operational steps of discharge component 110 discussed with reference to FIG. 2 may be downloaded to persistent storage 308 of discharge component 110 through communications unit 310.

I/O interface(s) 312 allows for input and output of data with other devices that may be connected to discharge component 110 and rechargeable battery 100. For example, I/O interface(s) 312 may provide a connection to disengagement sensor 104, charge indicator 108, and functions of override button 106 and any external device(s) 316 such as a keypad, a touch screen, and/or some other suitable input device. External device(s) 316 can also include portable computer readable storage media such as, for example, thumb drives, portable optical or magnetic disks, and memory cards. Software and data used to practice embodiments of the present invention, e.g., executing the operational steps of discharge component 110 in rechargeable battery 100 can be stored on such portable computer readable storage media and can be loaded onto persistent storage 308 via I/O interface(s) 312. I/O interface(s) 312 may in some embodiments, also connect to display 318.

In one embodiment, display 318 provides a mechanism to display data to a user and may be, for example, a computer monitor. Display 318 can also function as a touchscreen, such as a display of a tablet computer.

Aspects of the present invention are described herein with reference to flowchart illustrations and/or block diagrams of methods, apparatus (systems), and operational steps, for example of a computer program product, according to embodiments of the invention. It will be understood that each block of the flowchart illustrations and/or block diagrams, and combinations of blocks in the flowchart illustrations and/or block diagrams, can be implemented by computer readable program instructions.

The control logic of discharge component 110 and/or computer readable program instructions may also be loaded onto a computer processing device, a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The present invention may be a system, a method, and/or a computer program product. The computer program product may include a computer readable storage medium (or media) having computer readable program instructions thereon for causing a processor to carry out aspects of the present invention.

The computer readable storage medium can be any tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers, and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, a special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, a segment, or a portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application, or technical improvement over technologies found in the marketplace, or to enable others of ordinary skill in the art to understand the embodiments disclosed herein.

What is claimed is:

1. A method for an electrical component executing control logic to provide a discharge of a rechargeable battery to a predetermined state of charge, the method comprising:
   determining, by an electrical component, a rechargeable battery is not connected to a device using a sensor wherein the sensor determines a status of at least one of a physical function or an electrical connection;
   determining, by the electrical component, whether an indication to override discharging of the rechargeable battery is received;
   responsive to receiving the indication to override discharging of the rechargeable battery, halting, by the electrical component, discharge of the rechargeable battery;
   responsive to not receiving the indication to override discharging of the rechargeable battery, discharging, by the electrical component, the rechargeable battery using a passive discharge component in a portion of the rechargeable battery;
   determining, by the electrical component, a state of charge by retrieving the state of charge from one of an internal battery management system or an external tester connected to the rechargeable battery;
   determining, by the electrical component, whether the state of charge is below a minimum threshold state of charge, wherein the minimum threshold state of charge is determined based on one of a predetermined minimum threshold state of charge or a user-selected minimum threshold state of charge input by user on a dial, a button, a switch, a toggle, or a touch screen provided by a charge indicator in the rechargeable battery;
   communicating, by the electrical component, whether a state of charge is below the minimum threshold state of charge to a charge indicator, wherein the charge indicator indicates that the recharge battery is below the predetermined minimum threshold by a first color;
   determining, by the electrical component, whether a state of charge exceeds the predetermined state of charge in the rechargeable battery wherein the predetermined state of charge is one of a configured predetermined maximum threshold state of charge or a user-selected maximum threshold state of charge input by user on a dial, a button, a switch, a toggle, or a touch screen provided by a charge indicator in the rechargeable battery;
   responsive to determining that the state of charge exceeds the predetermined state of charge, continuing, by the electrical component, discharging the rechargeable battery;
   communicating, by the electrical component, that the state of charge exceeds the predetermined state of charge to the charge indicator wherein the charge indicator indicates that the rechargeable battery is above the predetermined maximum threshold state of charge by a second color;
   determining, by the electrical component, whether the state of charge for the rechargeable battery that exceeded the predetermined state of charge does not exceed the predetermined state of charge;
   responsive to determining that the state of charge for the rechargeable battery that exceeded the predetermined state of charge does not exceed the predetermined state of charge, halting, by the electrical component, discharge the rechargeable battery; and
   communicating, by the electrical component, that the state of charge does not exceed the predetermined state of charge and is not below the minimum threshold state of charge to the charge indicator wherein the charge indicator indicates by a third color that the rechargeable battery does not exceed the predetermined state of charge and is not below the minimum threshold state of charge.

* * * * *